(12) United States Patent
Park et al.

(10) Patent No.: US 10,651,426 B2
(45) Date of Patent: May 12, 2020

(54) ORGANIC LIGHT EMITTING DIODE DISPLAY DEVICE

(71) Applicant: LG Display Co., Ltd., Seoul (KR)

(72) Inventors: Han-Sun Park, Paju-si (KR); Won-Hoe Koo, Goyang-si (KR); Ji-Hyang Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/822,417

(22) Filed: Nov. 27, 2017

(65) Prior Publication Data

US 2018/0151842 A1    May 31, 2018

(30) Foreign Application Priority Data

Nov. 30, 2016  (KR) ........................ 10-2016-0161861

(51) Int. Cl.
*H01L 51/52*  (2006.01)
*H01L 27/32*  (2006.01)

(52) U.S. Cl.
CPC ........ *H01L 51/5275* (2013.01); *H01L 27/322* (2013.01); *H01L 27/3211* (2013.01); *H01L 27/3276* (2013.01); *H01L 51/525* (2013.01); *H01L 51/5284* (2013.01)

(58) Field of Classification Search
None
See application file for complete search history.

(56) References Cited

U.S. PATENT DOCUMENTS

| 9,529,189 | B1* | 12/2016 | Langendijk | ........ G02B 19/0019 |
|---|---|---|---|---|
| 2005/0270446 | A1 | 12/2005 | Kim et al. | |
| 2009/0290083 | A1* | 11/2009 | Lim | ........................ G02F 1/1368 349/46 |
| 2012/0133855 | A1* | 5/2012 | Whangbo | ............. G02F 1/1343 349/41 |
| 2014/0191203 | A1* | 7/2014 | Son | ...................... H01L 51/5284 257/40 |
| 2014/0191204 | A1* | 7/2014 | Jeong | .................... H01L 27/322 257/40 |
| 2017/0084677 | A1* | 3/2017 | Ha | ....................... H01L 27/3258 |

FOREIGN PATENT DOCUMENTS

CN          1704830 A       12/2005

OTHER PUBLICATIONS

First Notification of Office Action dated May 13, 2019, from the China National Intellectual Property Administration in counterpart Chinese application No. 201711224267.9. Note: US 2014/0191204 A1 US 2009/0290083 A1 and US 2012/0133855 A1 cited therein are already of record.

* cited by examiner

*Primary Examiner* — Michelle Mandala
*Assistant Examiner* — Jordan M Klein
(74) *Attorney, Agent, or Firm* — Morgan, Lewis & Bockius LLP

(57) ABSTRACT

An OLED display device includes a first substrate including a plurality of sub-pixels each including an emission area and a non-emission area; organic light emitting diodes on the first substrate; a second substrate opposed to the first substrate; a black matrix and a color filter layer on one side of the second substrate; a spacer on the black matrix and overlapping or parallel to one of the plurality of the gate lines and the plurality of data lines; and a film layer on the spacer, wherein an air gap is provided between the second substrate and the film layer, and a part of the film layer is exposed by the air gap.

27 Claims, 11 Drawing Sheets

ORGANIC LIGHT EMITTING DIODE DISPLAY DEVICE

CROSS-REFERENCE TO RELATED APPLICATION

The present application claims priority from and the benefit under 35 U.S.C § 119(a) of Korean Patent Application No. 10-2016-0161861 filed on Nov. 30, 2016, which is hereby incorporated by reference in its entirety.

BACKGROUND

Technical Field

The present disclosure relates to an organic light emitting diode display device.

Discussion of the Related Art

Organic light emitting diode (OLED) display devices can be manufactured to have relatively thin thicknesses and light weights because they are self-luminous and do not need a light source differently from liquid crystal display (LCD) devices. In addition, since the OLED display devices are driven by a low voltage, there are advantages in consuming electric power, and the OLED display devices also have excellent color implementation, response time, veining angles, and contrast ratios. Therefore, the OLED display devices have researched as next generation display devices.

Light emitted from an organic light emitting layer of an OLED display device is outputted to the outside of the OLED display device after passing through many components of the OLED display device. However, some of the light emitted from the organic light emitting layer is not outputted to the outside of the OLED display device and is locked in the OLED display device. There is a problem in light extraction efficiency of the OLED display device.

Particularly, in a bottom emission type OLED display device, light, which is totally reflected or absorbed by an anode electrode and locked in the OLED display device, is about 50% of light emitted from the organic light emitting layer, and light, which is totally reflected or absorbed by a substrate and locked in the OLED display device, is about 30% of light emitted from the organic light emitting layer. Like this, about 80% of light emitted from the organic light emitting layer is locked in the OLED display device, and about 20% is extracted to the outside. Accordingly, the light extraction efficiency is very low.

To increase the light extraction efficiency of the OLED display device, various methods have been suggested such that a microlens array (MLA) is attached to an outer surface of a substrate of the OLED display device or microlenses are formed in an overcoat layer of the OLED display device.

However, light emitted from an organic light emitting diode has an optical axis different from a polarization axis of a polarizer arranged on the outer surface of the substrate due to an application of the microlens array or the microlenses, and this causes a problem of lowering the light extraction efficiency.

SUMMARY

Accordingly, embodiments of the present disclosure are directed to an organic light emitting diode display device that substantially obviates one or more of the problems due to limitations and disadvantages of the related art.

An aspect of the present disclosure is to provide an organic light emitting diode display device capable of improving light extraction efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting diode display device comprises a first substrate including a plurality of sub-pixels, which are defined by a plurality of gate lines and a plurality of data lines crossing each other and each include an emission area and a non-emission area; organic light emitting diodes on the first substrate; a second substrate opposed to the first substrate; a black matrix and a color filter layer on one side of the second substrate, the black matrix disposed in the non-emission area and the color filter layer disposed in the emission area of at least one sub-pixel of the plurality of sub-pixels; a spacer on the black matrix and overlapping or parallel to one of the plurality of the gate lines and the plurality of data lines; and a film layer on the spacer, wherein an air gap is provided between the second substrate and the film layer, and a part of the film layer is exposed by the air gap.

In another aspect, an organic light emitting diode display device comprises a substrate including a plurality of sub-pixels, each of which includes an emission area and a non-emission area; a black matrix and a color filter layer on one side of the substrate, the black matrix disposed in the non-emission area and the color filter layer disposed in the emission area of at least one sub-pixel of the plurality of sub-pixels; a spacer on the black matrix; and a film layer on the spacer, wherein the at least one sub-pixel includes an air gap provided between the substrate and the film layer, and a part of the film layer is exposed by the air gap.

In another aspect, an organic light emitting diode display device comprises a substrate including a plurality of sub-pixels, each of which includes an emission area and a non-emission area; a black matrix and a color filter layer on one side of the substrate, the black matrix disposed in the non-emission area and the color filter layer disposed in the emission area of at least one sub-pixel of the plurality of sub-pixels; and a resin layer on the black matrix and the color filter layer, wherein at least one sub-pixel does not include a color filter layer, and the at least one sub-pixel without the color filter layer includes an air gap surrounded by the substrate, the resin layer opposed to the substrate, and the black matrix between the substrate and the resin layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
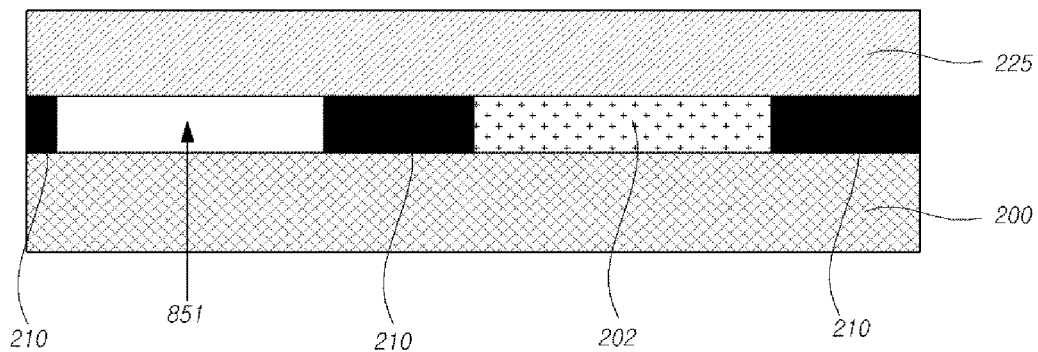
FIG. 1 is a schematic cross-sectional view of a second substrate of an organic light emitting diode (OLED) display device according to a first embodiment of the present disclosure.

Reference will now be made in detail to embodiments of the present disclosure, examples of which are illustrated in the accompanying drawings. The embodiments set forth herein are provided for illustrative purposes to fully convey the concept of the present disclosure to a person skilled in the art. The present disclosure should not be construed as being limited to these embodiments and may be embodied in many different forms. In the drawings, the size and thickness of the device may be exaggerated for the sake of clarity. Throughout this document, the same reference numerals and symbols will be used to designate the same or like components.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in many different forms. Rather, these embodiments are provided so that the present disclosure will be thorough and complete, and will fully convey the scope of the present disclosure to a person skilled in the art. The scope of the present disclosure shall be defined by the appended claims. Throughout this document, the same reference numerals and symbols will be used to designate the same or like components. In the drawings, the sizes and relative sizes of layers and areas may be exaggerated for the sake of clarity.

It will be understood that when an element or a layer is referred to as being "on" another element or layer, not only can it be "directly on" the other element or layer, but it can also be "indirectly on" the other element or layer via an "intervening" element or layer. In contrast, when an element or a layer is referred to as being "directly on" another element or layer, it will be understood that no intervening element or layer is interposed.

Spatially relative terms such as "below," "beneath," "under," "lower," "above," and "upper" may be used herein for the ease of description of the relationship of an element or components to another element or other components as illustrated in the drawings. The spatially relative terms should be construed as terms encompassing different orientations of the element in use or operation in addition to the orientation depicted in the drawings. For example, when elements illustrated in the drawings are turned over, an element described as "below," "beneath," or "under" another element would then be oriented "above" the other element. Thus, the example term "below," "beneath," or "under" can encompass both orientations of above and below.

FIG. 1 is a schematic cross-sectional view of a second substrate of an organic light emitting diode (OLED) display device according to a first embodiment of the present disclosure. Referring to FIG. 1, the OLED display device according to the first embodiment includes a black matrix 210 and a color filter layer 202 on a second substrate 200. At this time, the color filter layer 202 can be omitted in a region corresponding to at least one sub-pixel of the display device.

A resin layer 225 may be provided on the black matrix 210 and the color filter layer 202. At this time, in the sub-pixel where the color filter layer 202 is not disposed, an air gap 851, which is defined by the second substrate 200, the resin layer 225 opposite to the second substrate 200 and the black matrix 210 interposed between the second substrate 200 and the resin layer 225, may be provided. Namely, one surfaces of the second substrate 200 and the resin layer 225 may be exposed to the air gap 851.

In the OLED display device according to the present embodiment, since the air gap 851 is provided only in a region where the color filter layer 202 is not disposed, there is an effect that light emitted from an organic light emitting diode in the sub-pixel where the color filter layer 202 is not disposed can be further extracted out of the second substrate 200.

Figure 2:
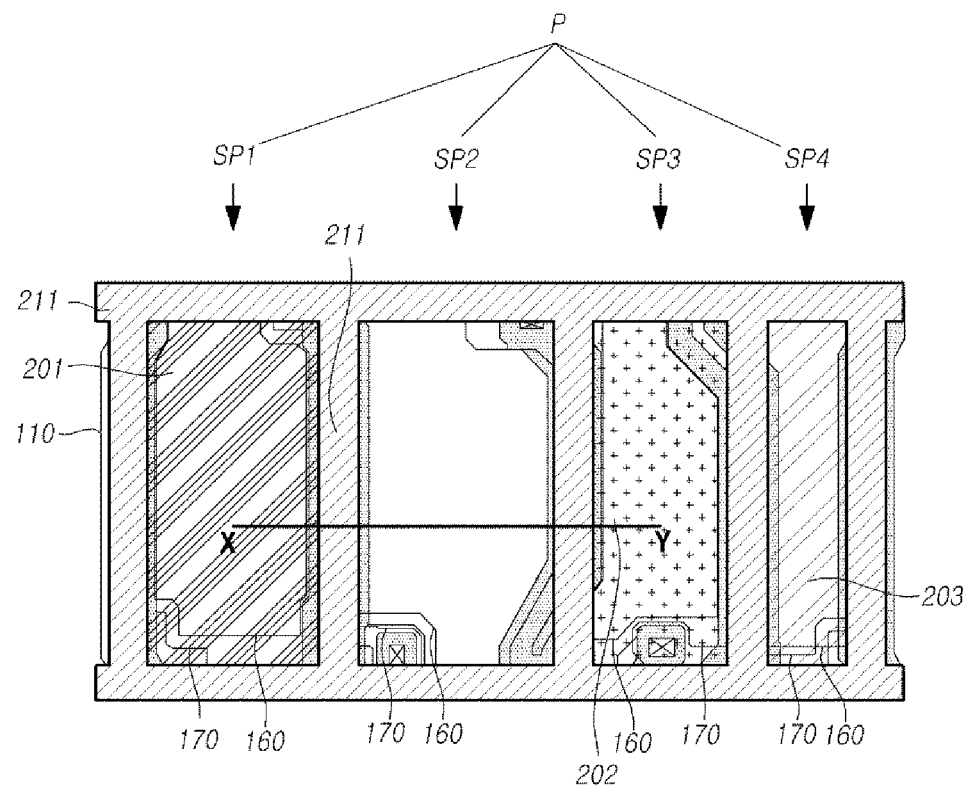
FIG. 2 is a plan view of partially illustrating a display panel of a display device according to a second embodiment of the present disclosure.

FIG. 2 is a plan view of partially illustrating a display panel of a display device according to a second embodiment of the present disclosure. Referring to FIG. 2, the display panel according to the second embodiment has a pixel P including a plurality of sub-pixels SP1, SP2, SP3 and SP4. Each sub-pixel SP1, SP2, SP3 and SP4 can be defined by a gate line extending in a first direction and a data line 110 extending a second direction different from the first direction.

Specifically, one pixel P may include a first sub-pixel SP1, a second sub-pixel SP2, a third sub-pixel SP3, and a fourth sub-pixel SP4. Here, at least one sub-pixel may be a sub-pixel emitting white light W.

Meanwhile, in FIG. 2, one pixel includes four sub-pixels SP1, SP2, SP3 and SP4. However, the display panel according to the present embodiments is not limited thereto. For example, the display panel according to the present embodiments may include two or three sub-pixels on pixel P, and at least one sub-pixel of the plurality of sub-pixels included in two pixels P adjacent to each other may emit white light W.

Hereinafter, for convenience of explanation, the display panel has one pixel P including four sub-pixels SP1, SP2, SP3 and SP4. At this time, the four sub-pixels SP1, SP2, SP3 and SP4 included in the pixel P may be referred to as a first sub-pixel SP1, a second sub-pixel SP2, a third sub-pixel SP3, and a fourth sub-pixel SP4, and the sub-pixels SP1, SP2, SP3 and SP4 may emit different colors.

Additionally, in the following embodiments, the first sub-pixel SP1 is a sub-pixel emitting red light R, the second sub-pixel SP2 is a sub-pixel emitting white light W, the third sub-pixel SP3 is a sub-pixel emitting blue light B, and the fourth sub-pixel SP4 is a sub-pixel emitting green light G.

In the Meantime, FIG. 2 shows emission areas of the sub-pixels SP1, SP2, SP3 and SP4. However, each of the sub-pixels SP1, SP2, SP3 and SP4 may further include a circuit region that comprises a circuit for driving the organic light emitting diode of the emission area.

Here, the organic light emitting diode disposed in each sub-pixel SP1, SP2, SP3 and SP4 may be an organic light emitting diode emitting white light W, and the present embodiment is not limited thereto. For example, an organic light emitting diode emitting red light R may be disposed in the sub-pixel emitting red light R, an organic light emitting diode emitting green light G may be disposed in the sub-pixel emitting green light G, an organic light emitting diode emitting blue light B may be disposed in the sub-pixel emitting blue light B, and an organic light emitting diode emitting white light W may be disposed in the sub-pixel emitting white light W.

Hereinafter, for convenience of explanation, the description will be focused on a configuration in which all the organic light emitting diodes disposed in the respective sub-pixels SP1, SP2, SP3 and SP4 are organic light emitting diodes emitting white light W.

Emission areas EA of the sub-pixels SP1, SP2, SP3 and SP4 may have different sizes from each other. The size of the emission area EA of each sub-pixel SP1, SP2, SP3 and SP4 may be adjusted in consideration of color coordinates of the display panel and lifetime of the organic light emitting diode.

Meanwhile, an insulation layer including a microlens array which comprises a plurality of convex portions and a plurality of concave portions may be disposed under the organic light emitting diode on a substrate on which the organic light emitting diodes are disposed (hereinafter referred to as a first substrate). Here, the insulation layer may be an overcoat layer, and the insulation layer of the present embodiment is not limited thereto.

The organic light emitting diode may include a first electrode, an organic light emitting layer and a second electrode. Light emitted from the organic light emitting layer of the organic light emitting diode is totally reflected within the organic light emitting layer and the first electrode and is trapped, while a path of the light source totally reflected is changed to an angle smaller than the critical angle of the total reflection due to the inserted microlens array, whereby an external light emission efficiency can be improved by an increase of the light source extracted to the outside.

In addition, color filter layers 201, 202 and 203 may be disposed in some sub-pixels SP1, SP3 and SP4 on a surface of a second substrate opposing the first substrate where the organic light emitting diodes are disposed such that the color filters layers 201, 202 and 203 overlap the emission areas. Specifically, a first color filter layer 201 is disposed in the first sub-pixel SP1, a second color filter layer 202 is disposed in the third sub-pixel SP3, and a third color filter layer 203 is disposed in the fourth sub-pixel SP4.

Meanwhile, in the present embodiment, there is no color filter layer in the second sub-pixel SP2, and the present embodiment is not limited thereto. Alternatively, the second sub-pixel SP2 may also include a color filter layer.

In the display device according to the second embodiment, the overcoat layer is disposed on a thin film transistor for driving the organic light emitting diode to flatten a surface of the first substrate. The overcoat layer may include a microlens array to improve outer light extraction efficiency in areas corresponding to emission areas.

When the display device includes a microlens array structure, light, which was trapped in the organic light emitting layer and the electrodes of the organic light emitting diode while being totally reflected, travels at an angle smaller than the critical angle for total reflection due to the microlens array structure and is multi-reflected, thereby improving the external luminous efficiency of the display device.

Meanwhile, a polarizer is provided on one side of the first substrate and the second substrate for lowering the reflectance of external light. When light emitted from the organic light emitting layer is multi-reflected by the microlens array structure and progresses with an angle smaller than the critical angle for total reflection to reach the polarizer, light having an optical axis perpendicular to a polarization axis of the polarizer is absorbed by the polarizer. As a result, the light extraction efficiency may decrease.

To solve this, the display device according to the present embodiment changes the optical axis before light emitted from the organic light emitting layer reaches the substrate such that the light is not absorbed by the polarizer and is outputted to the outside of the display device.

Hereinafter, in the following description, a partition wall, a color filter pattern, a transparent organic layer, a transparent inorganic layer, or the like may be replaced with a spacer, and any one of the above-described terms may be used according to each embodiment.

The second embodiment may further include a black matrix corresponding to boundaries of the emission area of each sub-pixel SP1, SP2, SP3 and SP4 and a partition wall 211 overlapping the black matrix on one side of the second substrate. Specifically, the black matrix and the partition wall 211 may be disposed in an area overlapping the gate lines and the data lines 110.

The black matrix and the partition wall 211 are parallel to the gate lines, overlap the data lines 110, and are disposed in a non-emission area. Thus, the emission areas of the sub-pixels SP1, SP2, SP3 and SP4 cannot be screened and can be opened by the black matrix and the partition wall 211. In other words, the black matrix and the partition wall 211 may be arranged to expose the emission areas. That is, since the black matrix and the partition wall 211 are arranged so as to expose the emission areas, an area for the emission area of each sub-pixel SP1, SP2, SP3 and SP4 is not affected.

A film layer may be disposed on the partition wall 211. At this time, an air gap may be provided between the color filter layer 201, 202 and 203 and the film layer in each sub-pixel SP1, SP2, SP3 and SP4. At this time, an air layer having a refractive index of 1 may be provided in the air gap.

Here, light emitted from the organic light emitting layer is totally reflected at an interface between the air layer and another component (a resin layer, for example), thereby inducing multiple reflection in the device. Light multi-reflected is changed such that its optical axis is parallel to the polarization axis of the polarizer and is outputted to the outside of the display device. As a result, the light extraction efficiency of the display device may increase.

Figure 3:
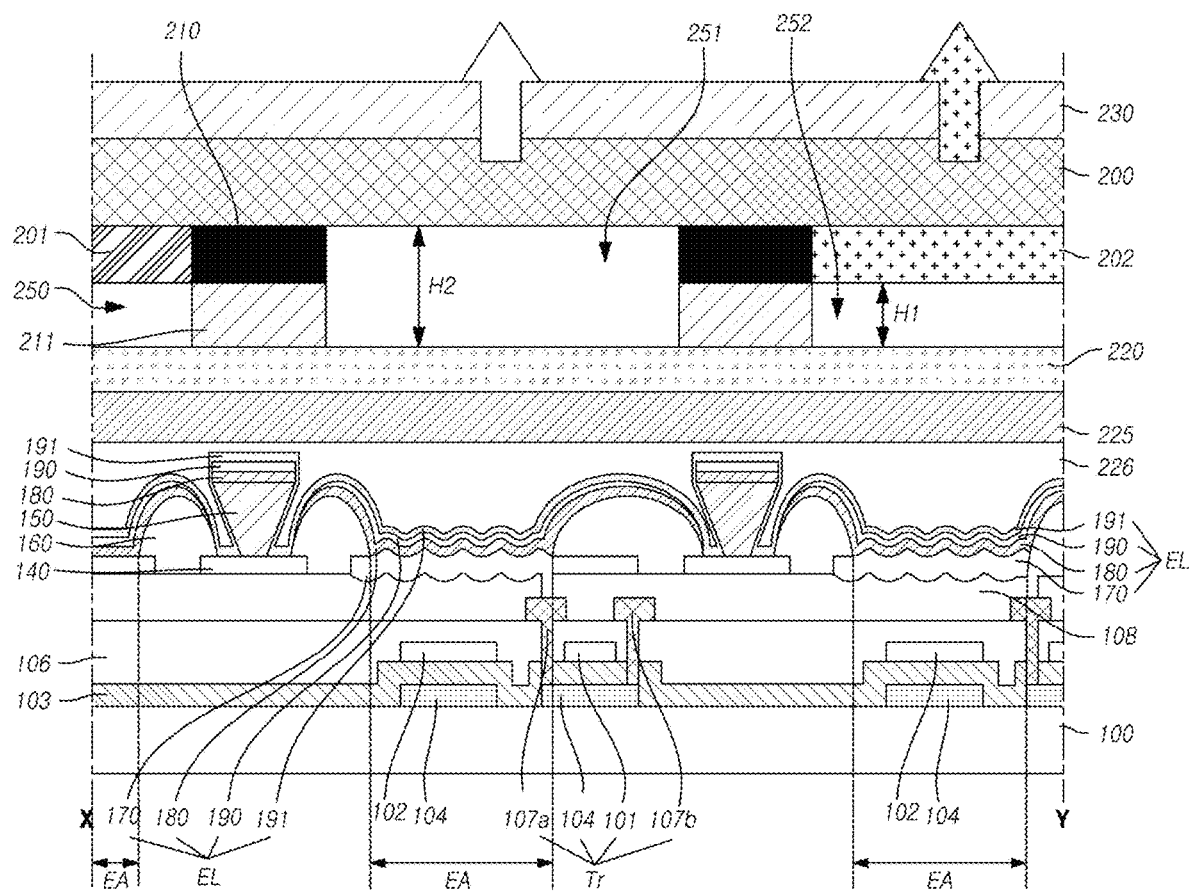
FIG. 3 is a cross-sectional view taken along the ling X-Y of FIG. 2.

This configuration will be described in detail with reference to FIG. 3. FIG. 3 is a cross-sectional view taken along the ling X-Y of FIG. 2.

Referring to FIG. 3, a gate electrode 101, a gate line 102, a gate insulation layer 103, an active layer 104, an interlayer insulation layer 106, and source and drain electrodes 107a and 107b are sequentially formed on a first substrate 100.

Here, a thin film transistor Tr includes the gate electrode 101, the active layer 104, the source electrode 107a and the drain electrode 107b.

For convenience of explanation, the present embodiment illustrates only a driving thin film transistor among various thin film transistors that can be included in the display device. In addition, the thin film transistor Tr of the present embodiment is described as a coplanar structure or a top gate structure in which the gate electrode 101 is disposed on the same side as the source and drain electrodes 107a and 107b with respect to the active layer 104. Alternatively, the thin film transistor Tr may have an inverted staggered structure or a bottom gate structure in which the gate electrode 101 is disposed on the opposite side of the source and drain electrodes 107a and 107b with respect to the active layer 104.

An overcoat layer 108 is disposed on the thin film transistor Tr and the interlayer insulation layer 106. The overcoat layer 108 may include a microlens array having a plurality of convex portions or a plurality of concave portions in an area corresponding to an emission area EA.

A first electrode 170 of an organic light emitting diode EL and an auxiliary electrode 140 spaced apart from the first electrode 170 is disposed on the overcoat layer 108. At this time, the auxiliary electrode 140 may be formed on the same layer and formed of the same material as the first electrode 170, but the present embodiment is not limited thereto.

A bank pattern 160 is disposed on part of a top surface of the overcoat layer 108, both ends of the auxiliary electrode 140, and both ends of the first electrode 170 to define the emission area EA and the non-emission area excluding the emission area EA. In addition, a partition wall 150 is disposed on part of a top surface of the auxiliary electrode 140.

An organic light emitting layer 180 and a second electrode 190 and 191 of the organic light emitting diode EL may be disposed on the partition wall 150, the bank pattern 160 and the first electrode 170. Here, the organic light emitting layer 180 may not be disposed on the auxiliary electrode 140, and the top surface of the auxiliary electrode 140 may contact the second electrode 190 and 191. Since the auxiliary electrode 140 and the second electrode 190 and 191 contact each other, it is possible to prevent voltage from being dropped due to resistance of the second electrode 190 and 191. Meanwhile, in the present embodiment, the second electrode 190 and 191 includes double layers for each contact between the second electrode 190 and 191 and the auxiliary electrode 140. However, the present embodiment is not limited thereto, and it is sufficient that the second electrode 190 and 191 includes at least one layer.

In the organic light emitting diode EL according to the present embodiment, the first electrode 170 may be formed of a metallic material having relatively high reflectance, and the second electrode 190 and 191 may be formed of a transparent conductive material. Therefore, some of light emitted from the organic light emitting layer 180 is emitted toward the second electrode 190 and 191 and travels toward the second substrate 200, and the other of light emitted from the organic light emitting layer 180 is reflected by the first electrode 170 and travels toward the second substrate 200.

As described above, the display device according to the present embodiment is a top emission type in which the first electrode 170 functions as a reflective electrode and light emitted from the organic light emitting diode EL is reflected by the first electrode 170. However, the present embodiment is not limited thereto, and a bottom emission type may be applied to the display device.

In the meantime, the first electrode 170, the organic light emitting layer 180 and the second electrode 190 and 191 of the organic light emitting diode EL may have a shape following morphology of the overcoat layer 108 in an area corresponding to the emission area EA. Namely, the first electrode 170, the organic light emitting layer 180 and the second electrode 190 and 191 may have a plurality of convex curves and a plurality of concave curves in the emission area EA.

A passivation layer 226 may be provided on the organic light emitting diode EL to protect the organic light emitting diode EL.

Moreover, a resin layer 225 may be provided on the passivation layer 226 and may contact a film layer 220 on a second substrate 200, which will be described later. In other words, the resin layer 225 may be disposed between the passivation layer 226 on the first substrate 100 and the film layer 220 on the second substrate 200 to bond them together. In addition, the resin layer 225 may be formed of a transparent organic material, and thus light emitted from the organic light emitting diode EL can be transmitted therethrough without being absorbed.

A polarizer 230 is disposed on one surface of the second substrate 200 facing the first substrate 100 to lower the reflectance of the external light. A black matrix 210 and color filter layers 201 and 202 may be disposed on the other surface of the second substrate 200. At this time, the color filter layers 201 and 202 may overlap the emission area EA, and the black matrix 210 may overlap the non-emission area. In addition, a color filter layer may not be disposed in at least one of four sub-pixels constituting one pixel.

A partition wall 211 may be disposed on the black matrix 210. At this time, the black matrix 210 and the partition wall 211 may be formed of an opaque organic material. In FIG. 3, the black matrix 210 is disposed on the second substrate 200, and the partition wall 211 is disposed on the black matrix 210. However, the present embodiment is not limited thereto and may also include a configuration in which the partition wall 211 is disposed on the second substrate 200 and the black matrix 210 is disposed on the partition wall 211.

The film layer 220 is disposed on the partition wall 211. The film layer may be provided on both the emission area EA and the non-emission area. The film layer 220 may be formed of a transparent material. Accordingly, even if the film layer 220 is provided in the emission area EA, light emitted from the organic light emitting diode EL can be transmitted without being absorbed.

Meanwhile, the second sub-pixel of the present embodiment may include an air gap 251 (hereinafter, referred to as first air gap) surrounded by the second substrate 200, the black matrix 210, the partition wall 211 and the film layer 220 in an area corresponding the emission area EA. Specifically, the first air gap 251 may be provided in an area surrounded by the second substrate 200, the film layer 220 opposed to the second substrate 200, and the black matrix 210 and the partition wall 211 between the second substrate 200 and the film layer 220.

In the meantime, a refractive index of the passivation layer 226 may be equal to or less than a refractive index of the resin layer 225, and the refractive index of the resin layer 225 may be equal to or less than a refractive index of the film layer 220. The refractive index of the film layer 220 may be greater than the refractive index of the air layer provided in the first air gap 251.

Therefore, light emitted from the organic light emitting diode EL passes through the passivation layer 226, the resin layer 225 and the film layer 220 and is totally reflected between the film layer 220 and the first air gap 251. At this time, light totally reflected may be light incident on the interface between the film layer 220 and the first air gap 251 at a total reflection critical angle or more. On the other hand, light incident on the interface between the film layer 220 and the first air gap 251 at an angle smaller than the total reflection critical angle may be extracted out of the second substrate 200.

Meanwhile, light totally reflected at the interface between the film layer 220 and the air gap 251 has a path changed toward the first substrate 100. The light having the changed path is reflected by the first electrode 170 again, and its path is changed toward the second direction 200. Light incident on the interface between the film layer 220 and the first air gap 251 at the total reflection critical angle or more is multi-reflected as described above. The light incident on the interface between the film layer 220 and the first air gap 251 at the total reflection critical angle or more may be multi-reflected until it is incident on the interface between the film layer 220 and the first air gap 251 at an angle smaller than the total reflection critical angle.

In the meantime, the partition wall 211 according to the present embodiment may be formed of an opaque organic material. Since the partition wall 211 is formed of an opaque organic material, it is possible to prevent light emitted in one sub-pixel from being transferred to another sub-pixel due to multiple reflection.

Like this, since the second sub-pixel includes the first air gap 251, light emitted from the organic light emitting diode EL may be multi-reflected in the panel. The optical axis of light, which has a different direction from the polarization axis of the polarizer 230, can be changed to have the same direction as the polarization axis of the polarizer 230 through the multiple reflection. Accordingly, among light emitted from the organic light emitting diode EL, light having the optical axis different from the polarization axis of the polarizer 230 is changed to have the same optical axis as the polarization axis of the polarizer 230 through the multiple reflection, and the amount of light extracted out of the polarizer 230 can be increased.

Moreover, the first sub-pixel of the present embodiment may include an air gap 250 (hereinafter, referred to as second air gap) surrounded by the first color filter layer 201, the partition wall 211 and the film layer 220 in an area corresponding to the emission area EA. At this time, an air layer may be provided in the second air gap 250. The third sub-pixel may include an air gap 252 (hereinafter, referred to as third air gap) surrounded by the second color filter layer 202, the partition wall 211 and the film layer 220 in an area corresponding to the emission area EA. At this time, an air layer may be provided in the third air gap 252. In addition, although not shown in the figure, the fourth sub-pixel may also include an air gap (hereinafter, fourth air gap) surrounded by the third color filter layer, the partition wall 211, and the film layer 220.

Like this, since the first sub-pixel, the third sub-pixel and the fourth sub-pixel include the second air gap 250, the third air gap 252 and the fourth air gap, respectively, light emitted from the organic light emitting diode EL of each sub-pixel is multi-reflected, thereby increasing the quantity of light having the same optical axis as the polarization axis of the polarizer 230 through the multiple reflection. Thus, the amount of light extracted out of the polarizer 230 may be increased.

A detailed description of the structure as mentioned above will be described with reference to a third sub-pixel as an example for convenience of explanation.

Among light emitted from the organic light emitting diode EL in the third sub-pixel, light incident on the interface between the film layer 220 and the third air gap 252 at the total reflection critical angle or more is totally reflected at the interface between the film layer 220 and the third air gap 252. Light totally reflected at the interface between the film layer 220 and the third air gap 252 may be multi-reflected until it is incident on the interface between the film layer 220 and the third air gap 252 at an angle smaller than the total reflection critical angle.

Meanwhile, a height H1 of the third air gap 252 provided in the third sub-pixel may be lower than a height H2 of the first air gap 251 provided in the second sub-pixel. Specifically, the height H1 of the third air gap 252 may be equal to a height obtained by subtracting the height of the color filter layer 202 from the height H2 of the air gap 251. Therefore, the film layer 220 provided on the first air gap 251 and the third air gap 252 may have a flat surface.

Moreover, the height H1 of the third air gap 252 may be equal to the height of the partition wall 211. That is, the height of the first air gap 251 may be equal to a height obtained by adding the height of the black matrix 210 and the height of the partition wall 211.

In the OLED display device according to the present embodiment, since the partition wall 211 is disposed on the black matrix 210, the air gaps 250 and 251 may be provided between the color filter layers 201 and 202 and the film layer 220 in the first, third and fourth sub-pixels with the color filter layers as well as in the second sub-pixel without the color filter layer.

In other words, when the partition wall 211 is not disposed, the film layer 220 is disposed on the color filter layers 201 and 202. Thus, the first air gap 251 is provided in the second sub-pixel without the color filter layer, and it is difficult to provide the air gap in the other sub-pixels with the color filter layer. Namely, the partition wall 211 of the OLED display device according to the present embodiment enables the air gap to be provided between the color filter layers 201 and 202 and the film layer 220 in the first, third and fourth sub-pixels with the color filter layers 201 and 202.

Accordingly, since the first to fourth air gaps are provided in the first to fourth sub-pixels, light emitted from the organic light emitting diode EL is multi-reflected, thereby increasing the quantity of light having the same optical axis as the polarization axis of the polarizer 230 through the multiple reflection. Thus, the light extraction efficiency can be improved.

Meanwhile, the OLED display device according to the present embodiment may include the first to fourth air gaps in the first to fourth sub-pixels by disposing the film layer 220 between the partition wall 211 and the resin layer 225. Specifically, when the film layer 220 is not disposed between the partition wall 211 and the resin layer 225, the resin layer 225 penetrates into the first to fourth air gaps, and as a result, the air gap is not provided in each sub-pixel. That is, the OLED display device according to the present embodiment may include the film layer 220 between the partition wall 211 and the resin layer 225, and the film layer 220 may function as a barrier layer to prevent the resin layer 225 from penetrating into the air gaps provided in the first to fourth sub-pixels.

Figure 4:
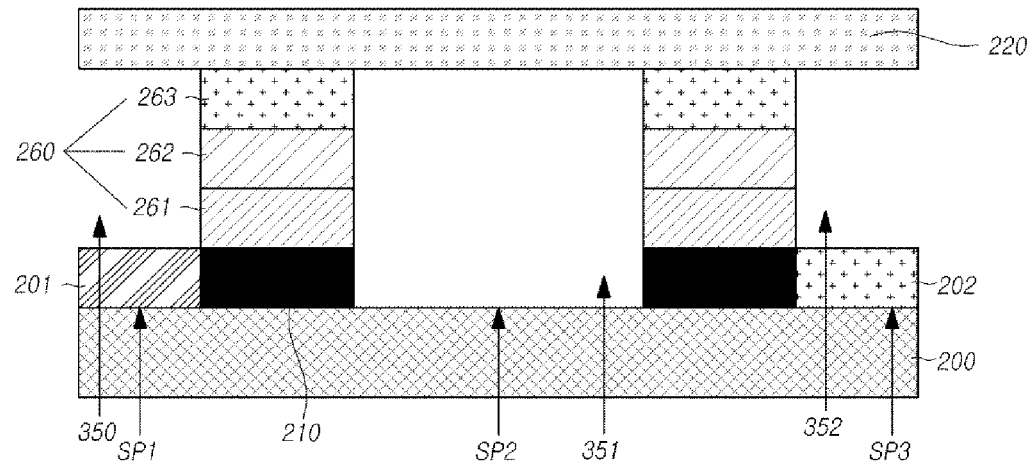
FIG. 4 is a view schematically showing a second substrate of an OLED display device according to a third embodiment.

However, the air gaps included in the sub-pixels are not limited to the configuration as shown in FIG. 3 and may be configured as shown in FIGS. 4 to 7. FIG. 4 is a view schematically showing a second substrate of an OLED display device according to a third embodiment. The OLED display device according to the third embodiment may include the same components as those of the above-described embodiment. A description overlapping the above-described embodiment may be omitted. Further, the same components may have the same reference signs.

Referring to FIG. 4, the OLED display device according to the third embodiment may include at least one color filter pattern 260 instead of the partition wall as compared with FIG. 3. For example, first, second and third color filter patterns 261, 262 and 263 may be provided on the black matrix 210. At this time, the first, second and third color filter patterns 261, 262 and 263 may have the same color or different colors.

The OLED display device according to the third embodiment includes a first air gap 351 surrounded by the second substrate 200, the black matrix 210, at least one color filter pattern 260 and the film layer 220 in the second sub-pixel SP2.

In addition, a second air gap 350, which is surrounded by the first color filter layer 201, the at least one color filter pattern 260 and the film layer 220, is provided in the first sub-pixel SP1. A third air gap 352, which is surrounded by the second color filter layer 202, the at least one color filter pattern and the film layer 220, is provided in the third sub-pixel SP3. Moreover, although not shown in the figure, a fourth air gap, which is surrounded by the third color filter layer, the at least one color filter pattern 260 and the film layer 220, is provided in the fourth sub-pixel.

That is, the OLED display device according to the third embodiment includes the air gaps each having the air layer in the respective sub-pixels to induce the multiple reflection of light emitted from the organic light emitting diode EL. The light passes through the polarizer after being multi-reflected, and the amount of light to be extracted out of the display device can be increased.

Meanwhile, the at least one color filter pattern 260 provided on the black matrix 210 is formed of an opaque organic material. It can be prevented that light emitted from one sub-pixel passes into another sub-pixel during the multiple reflection and is recognized as light leakage.

At this time, a thickness of the at least one color filter pattern 260 may be 5 μm to 9 μm. When the thickness of the at least one color filter pattern 260 is less than 5 μm, light emitted from the one sub-pixel may pass into another sub-pixel during the multiple reflection and may be recognized as light leakage. In addition, when the thickness of the at least one color filter pattern 260 exceeds 9 μm, it may be difficult to perform the forming process.

Figure 5:
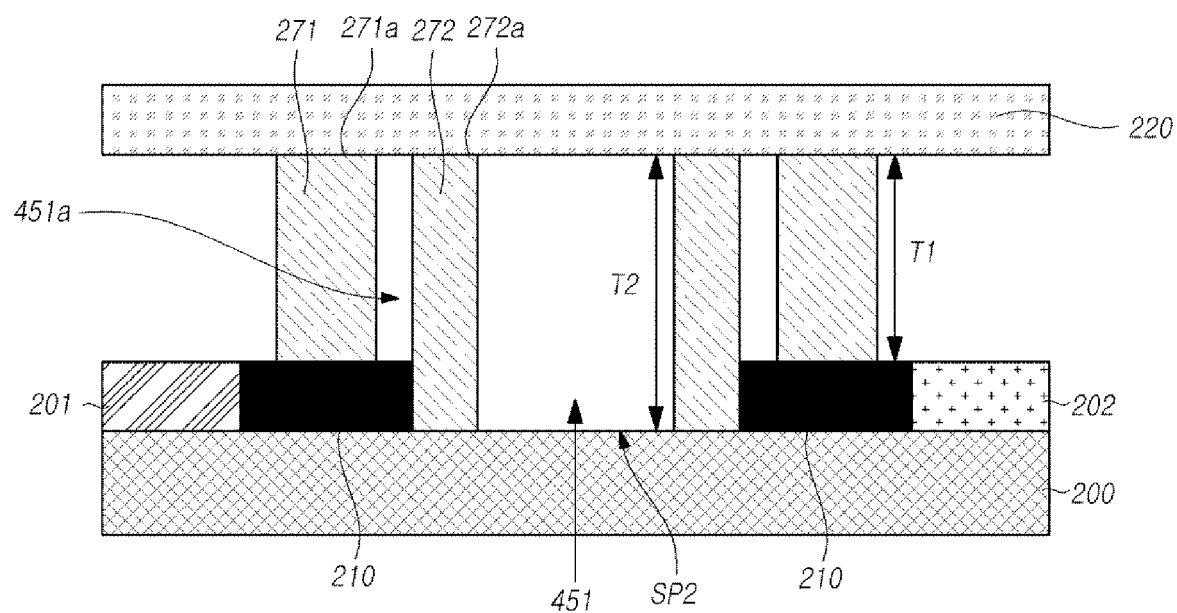
FIG. 5 is a view schematically showing a second substrate of an OLED display device according to a fourth embodiment.

FIG. 5 is a view schematically showing a second substrate of an OLED display device according to a fourth embodiment. The OLED display device according to the fourth embodiment may include the same components as those of the above-described embodiment. A description overlapping the above-described embodiment may be omitted. Further, the same components may have the same reference signs.

Referring to FIG. 5, the OLED display device according to the fourth embodiment may include a first transparent organic layer 271 instead of the partition wall on the black matrix 210 as compared with FIG. 3. In addition, at least one second transparent organic layer 272 may be provided on the second substrate 200 in an area corresponding to an emission area in the second sub-pixel. For example, as shown in FIG. 5, the second sub-pixel may include two second transparent organic layers 272 in the area corresponding to the emission area. At this time, one side of the second transparent organic layers 272 may be arranged to contact one side of the black matrix 210.

In other words, it is sufficient that the OLED display device according to the fourth embodiment includes the first transparent organic layer 271 disposed on the black matrix 210 and the at least one second transparent organic layers 272 in the area corresponding to the emission area.

In the meantime, a height T1 of the first transparent organic layer 271 disposed on the black matrix 210 may be lower than a height T2 of the second transparent organic layers 272 disposed on the second substrate 200 in the area corresponding to the emission area. More specifically, the sum of the height T1 of the first transparent organic layer 271 and a height of the black matrix 210 may be equal to the height T2 of the second transparent organic layers 272.

Therefore, a position of a top surface 271*a* of the first transparent organic layer 271 may be the same as a position of a top surface 272*a* of the second transparent organic layers 272. From this, the film layer 220 provided on the first transparent organic layer 271 and the second transparent organic layers 272 may be positioned without detachment.

Here, the height of the first transparent organic layer 271 may be 5 μm to 6 μm. Since the first transparent organic layer 271 has the above-described height, the transparent organic layer can be formed on the second substrate through a process having the same conditions as the process for forming the insulation layer (for example, the overcoat layer) provided on the first substrate. Thus, there is an effect that the process can be simplified.

Meanwhile, an air gap 451 may be provided between the two second transparent organic layers 272 disposed in the area corresponding to the emission area of the second sub-pixel. More specifically, the air gap 451 may be provided to be surrounded by the second substrate 200, the film layer 220 opposed to the second substrate 200, and the second transparent organic layers 272 between the second substrate 200 and the film layer 220.

Here, the second transparent organic layers 272 may be formed of a material for the overcoat layer, but the present embodiment is not limited thereto. In addition, a material of the first transparent organic layer 271 may be the same as the material of the second transparent organic layers 272, but the present embodiment is not limited thereto. Namely, refractive indexes of the first transparent organic layer 271 and the second transparent organic layers 272 may be greater than the refractive index of the air layer provided in the air gap 451.

Moreover, the first transparent organic layer 271 and the second transparent organic layers 272 according to the present embodiment may be spaced apart from each other in a cross-sectional view. At this time, a space 451*a* may be provided between the first transparent organic layer 271 and the second transparent organic layer 272, and an air layer having the refractive index lower than the first and second transparent organic layers 271 and 272 may be provided in the space 451*a*. Here, some of light incident on the second transparent organic layer 272 from the air gap 451 is totally reflected at an interface between the second transparent organic layer 272 and the space 451*a*, which is provided between the first and second transparent organic layers 271 and 272, and is extracted out of the second substrate 200.

That is, the second transparent organic layer 272 can change a path of light heading toward the non-emission area to increase the amount of light that can be extracted out of the second substrate 200.

In addition, the OLED display device according to the fourth embodiment includes the at least one second transparent organic layer 272 in the area corresponding to the emission area. Thus, light reaching the second transparent organic layer 272 through the air layer is refracted due to the difference in the refractive indexes of the air layer and the second transparent organic layer 272 and is absorbed by the black matrix 210, thereby preventing light from passing into another sub-pixel and being recognized as the light leakage.

As described above, since the OLED display device according to the fourth embodiment includes the second substrate 200, the film layer 220 opposed to the second substrate 200, and the second transparent organic layers 272 between the second substrate 200 and the film layer 220, the OLED display device can include the air gap 451 in at least one sub-pixel. Thus, it is induced that light emitted from the organic light emitting diode is multi-reflected, thereby increasing the amount of light extracted out of the display device.

Moreover, FIG. 5 shows a configuration in which the at least one second transparent organic layer 272 is provided in the area corresponding to the emission area only in the second sub-pixel SP2, but the OLED display device according to the present embodiment is not limited thereto.

Figure 6:
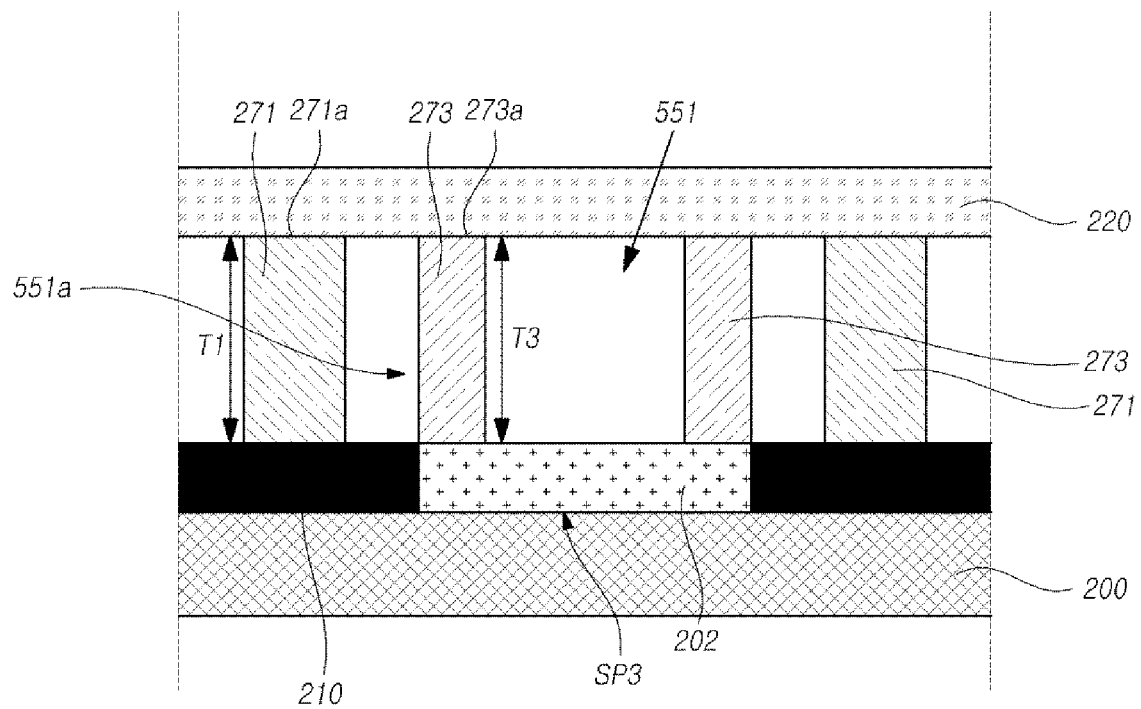
FIG. 6 is a cross-sectional view showing another example of the OLED display device according to the fourth embodiment.

This will be described below with reference to FIG. 6. FIG. 6 is a cross-sectional view showing another example of the OLED display device according to the fourth embodiment.

Referring to FIG. 6, the OLED display device according to the present embodiment includes the first transparent organic layer 271 on the black matrix 210 disposed in the non-emission area as described above referring to FIG. 5.

In addition, the OLED display device according to the present embodiment may include at least one third transparent organic layer 273 in at least one of the first sub-pixel, the third sub-pixel SP3 and the fourth sub-pixels. The third transparent organic layer 273 may be disposed on the color filter layer 202. That is, the third transparent organic layer 273 may be disposed in the emission area and may be formed of a transparent material to prevent an aperture area of the emission area from being narrowed.

A height T3 of the third transparent organic layer 273 may be the same as the height T1 of the first transparent organic layer 271. Accordingly, the film layer 220 provided on the first transparent organic layer 271 and the third transparent organic layer 273 may be positioned without detachment.

In the meantime, the OLED display device according to the present embodiment may include an air gap 551 between two third transparent organic layers 273 disposed in the area corresponding to the emission area. Light emitted from the organic light emitting diode passes through the air layer and reaches the third transparent organic layer 273, and the light reaching the third transparent organic layer 273 is refracted due to the difference in the refractive indexes of the air layer of the air gap 551 and the third transparent organic layer 272 and is absorbed by the black matrix 210, thereby preventing light from passing into another sub-pixel and being recognized as the light leakage.

As described above, since the OLED display device according to the fourth embodiment includes the color filter layer 202, the film layer 220 opposed to the color filter layer 202, and the third transparent organic layers 273 between the color filter layer 202 and the film layer 220, the OLED display device can include the air gap 551 in at least one sub-pixel. Thus, it is induced that light emitted from the organic light emitting diode is multi-reflected, thereby increasing the amount of light extracted out of the display device.

In addition, the first transparent organic layer 271 and the third transparent organic layers 273 according to the present embodiment may be spaced apart from each other in a cross-sectional view. At this time, a space 551a may be provided between the first transparent organic layer 271 and the third transparent organic layer 273, and an air layer having the refractive index lower than the first and third transparent organic layers 271 and 273 may be provided in the space 551a. Here, some of light incident on the third transparent organic layer 273 from the air gap 551 is totally reflected at an interface between the third transparent organic layer 273 and the space 551a, which is provided between the first and third transparent organic layers 271 and 273, and is extracted out of the second substrate 200.

That is, the third transparent organic layer 273 can change a path of light heading toward the non-emission area to increase the amount of light that can be extracted out of the second substrate 200.

Figure 7:
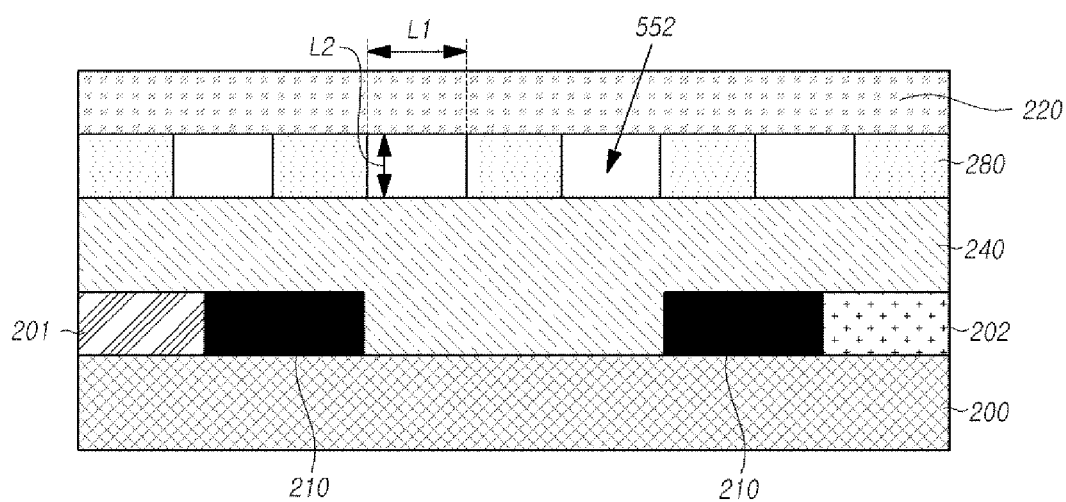
FIG. 7 is a view schematically showing a second substrate of an OLED display device according to a fifth embodiment.

FIG. 7 is a view schematically showing a second substrate of an OLED display device according to a fifth embodiment. The OLED display device according to the fifth embodiment may include the same components as those of the above-described embodiment. A description overlapping the above-described embodiment may be omitted. Further, the same components may have the same reference signs.

Referring to FIG. 7, an insulation layer 240 is provided on the second substrate 200 on which the black matrix 210 and the color filter layers 201 and 202 are disposed to flatten the second substrate 200. At this time, the insulation layer 240 may be formed of a transparent organic material. Accordingly, light emitted from the organic light emitting diode may not be absorbed by the insulation layer 240. A transparent inorganic layer 280 is provided on the insulation layer 240. The film layer 220 is disposed on the transparent inorganic layer 280.

Here, the transparent inorganic layer 280 may be patterned in the emission area and the non-emission area, and a pattern of the transparent inorganic layer 280 may be spaced apart from another pattern of the transparent inorganic layer 280 adjacent thereto. In addition, an air gap 552, which is surrounded by the insulation layer 240, the transparent inorganic layer 280 and the film layer 220, is provided.

More specifically, the air gap 552 is surrounded by the insulation layer 240, the film layer 220 opposed to the insulation layer 240, and the transparent inorganic layer 280 between the insulation layer 240 and the film layer 220. An air layer having the refractive index of 1 may be provided in the air gap 552. Some of light emitted from the organic light emitting diode is multi-reflected due to the air layer provided in the air gap 552 and is extracted to the outside of the second substrate 200.

Here, the insulation layer 240 may be formed of a transparent organic material, and the transparent inorganic layer 280 may be formed of a transparent inorganic material. Thus, light emitted from the organic light emitting diode may not be absorbed by the insulation layer 240 and the transparent inorganic layer 280.

Meanwhile, a separation distance L1 between two patterns of the transparent inorganic layer 280 adjacent to and spaced from each other in the cross-sectional view may be 2 μm to 4 μm. At this time, when the separation distance L1 is less than 2 the number of patterns of the transparent inorganic layer 280 in the emission area increases. Some of light incident on the air gap 552 may be refracted by the transparent inorganic layer 280, and some of the refracted light may be incident on and absorbed by the black matrix 210. That is, when the number of the patterns of the transparent inorganic layer 280 increases, the amount of light absorbed by the black matrix 210 increases, thereby lowering the luminous efficiency.

Moreover, when the separation distance L1 between the two patterns of the transparent inorganic layer 280 exceeds 4 μm, there may occur a phenomenon in which the film layer 220 on the transparent inorganic layer 280 may be bent and sag in some regions where the transparent inorganic layer 280 is not disposed. Furthermore, when the separation distance L1 between the two patterns of the transparent inorganic layer 280 is less than 2 μm, changes in a path of light incident on the air gap 552 provided in on sub-pixel may increase due to the transparent inorganic layer 280, thereby reducing the amount of light extracted out of the second substrate 200.

In addition, a height L2 of the pattern of the transparent inorganic layer 280 may be 1 μm to 3 μm. When the height L2 of the pattern of the transparent inorganic layer 280 is less than 1 μm, the air gap may not be sufficiently secured between the film layer 200 and the insulation layer 240. When the height L2 of the pattern of the transparent inorganic layer 280 exceeds 3 μm, the probability that light incident on the air gap 552 meets the transparent inorganic layer 280 may increase, and the light may be refracted at the interface between the pattern of the transparent inorganic layer 280 and the air gap 552 to thereby change its path. Therefore, the amount of light absorbed by the black matrix 210 may increase, so that the amount of light extracted out of the second substrate 200 may decrease.

As described above, since the OLED display device according to the fifth embodiment includes the insulation layer 240, the film layer 220 opposed to the insulation layer 240, and the transparent inorganic layer 280 between the insulation layer 240 and the film layer 220, the air gap may be provided in at least one sub-pixel. Thus, it is induced that light emitted from the organic light emitting diode is multi-reflected, thereby increasing the amount of light extracted out of the display device.

Figure 8:
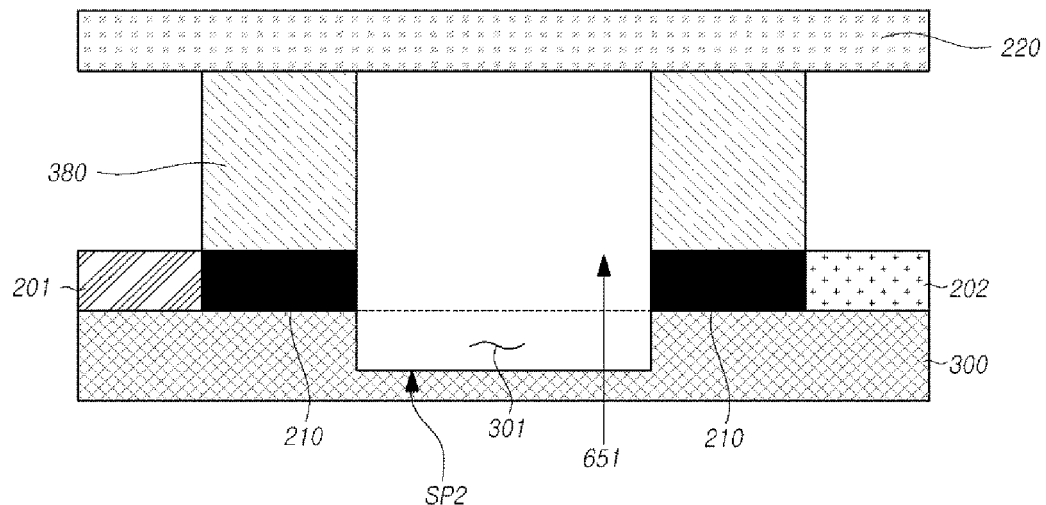
FIG. 8 is a view schematically showing a second substrate of an OLED display device according to a sixth embodiment.

FIG. 8 is a view schematically showing a second substrate of an OLED display device according to a sixth embodiment. The OLED display device according to the sixth embodiment may include the same components as those of the above-described embodiment. A description overlapping the above-described embodiment may be omitted. Further, the same components may have the same reference signs.

Referring to FIG. 8, a transparent organic layer 380 may be provided instead of the partition wall as compared with FIG. 3. That is, the transparent organic layer 380 may be provided on the black matrix 210. Here, a transparent inorganic layer may be used instead of the transparent organic layer 380. In addition, a second substrate 300 may include an indentation 301 in an area corresponding to an emission area in at least one sub-pixel. At this time, the second sub-pixel SP2 may include an air gap 651 surrounded by the second substrate 300, the black matrix 210, the transparent organic layer 380 and the film layer 220.

Specifically, the air gap 651 may be surrounded by top and side surfaces of the second substrate 300 corresponding to the indentation 301, the film layer 220 opposed to the second substrate 300, the black matrix 310, and the transparent organic layer 380. In addition, some of light emitted from the organic light emitting diode may be multi-reflected due to an air layer provided in the air gap 651 and may be extracted to the outside of the second substrate 300.

A height of the indentation 301 provided in the second substrate 300 may be 5 μm to 10 μm. Since the height of the indentation 301 is in the above-described range, the indentation 301 can be simply formed in the second substrate 300 through an etching process or the like.

Meanwhile, FIG. 8 shows that the second substrate 300 includes the indentation 301 in the area corresponding to the emission area in the second sub-pixel SP2 which does not include the color filter layer. However, the present embodiment is not limited to this. The second substrate 300 may include indentation 301 in at least one of the first, third and fourth sub-pixels.

Figure 9:
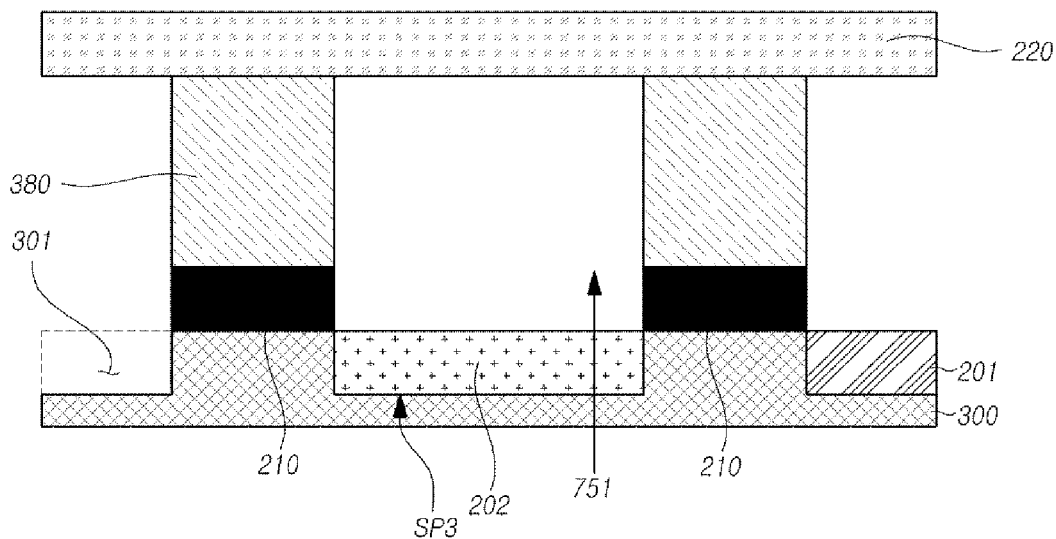
FIG. 9 is a cross-sectional view showing another example of the OLED display device according to the sixth embodiment.

This configuration will be described below in detail with reference to FIG. 9. FIG. 9 is a cross-sectional view showing another example of the OLED display device according to the sixth embodiment.

Referring to FIG. 9, when the second substrate 300 includes an indentation in at least one of the first sub-pixel, the third sub-pixel SP3 and the fourth sub-pixel, the color filter layer 202 may be disposed on the second substrate 300 including the indentation. Hereinafter, for the sake of convenience, the description of this embodiment will be made in the case where the indentation is formed in the second substrate 300 in the third sub-pixel SP3. The color filter layer 202 may be disposed at a position lower than the position of the black matrix 210 due to the indentation 301.

Meanwhile, an air gap 751 may be provided in the third sub-pixel SP3 and may be surrounded by the color filter layer 202, the film layer 220 opposed to the color filter layer 220, and the black matrix 210 and the transparent organic layer 380 between the color filter layer 202 and the film layer 220. At this time, an air layer may be provided in the air gap 751, and light emitted from the organic light emitting diode may be multi-reflected through the air layer and may be extracted to the outside of the second substrate 300.

As described above, to provide the air gap between the second substrate and the film layer 220, the partition wall, the at least one color filter pattern, the transparent organic layer or the transparent inorganic layer may be provided between the second substrate and the film layer 220.

However, the arrangement of the partition wall, the at least one color filter pattern, the transparent organic layer or the transparent inorganic layer of the OLED display device according to the present embodiments is not limited to the above-described position, and the arrangement may be as follows. In the following description, for the sake of convenience, it will be explained that the partition wall is used as the configuration for providing the air gap.

FIGS. 10 to 15 are plan views showing various positions of a configuration disposed between a second substrate and a film layer.

Figure 10:
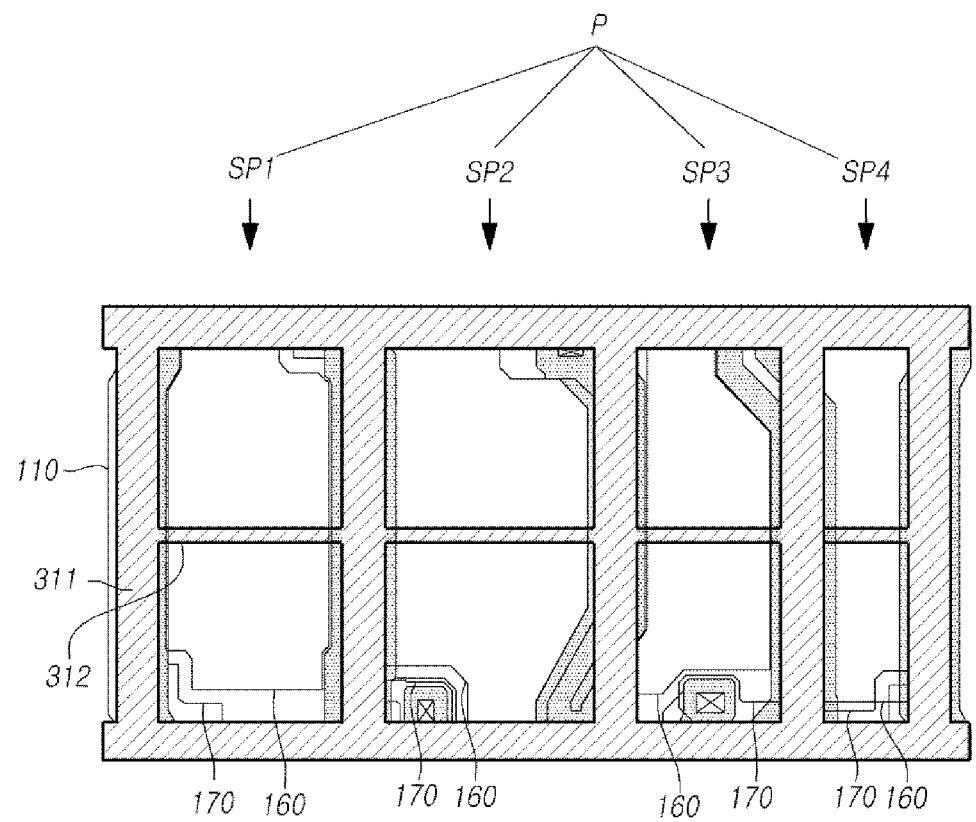
FIGS. 10 to 15 are plan views showing various positions of a configuration disposed between a second substrate and a film layer.

Referring to FIG. 10, a first partition wall 311 is provided on one side of the second substrate of the OLED display device according to the present embodiment. The first partition wall 311 is parallel to the gate line on the first substrate, overlaps the data line 110 on the first substrate, and is disposed in the non-emission area. In addition, a second partition wall 312 is provided on the one side of the second substrate. The second partition wall 312 is parallel to the gate line and crosses the emission areas of the first, second, third and fourth sub-pixels SP1, SP2, SP3 and SP4.

Meanwhile, in a region corresponding to the second sub-pixel SP2, the second partition wall 312 may be disposed to be in contact with the second substrate, and in a region corresponding to the first sub-pixel SP1, the third sub-pixel SP3 and the fourth sub-pixel SP4, the second partition wall 312 may be disposed to be in contact with the color filter layer provided on the second substrate.

Since the OLED display device of FIG. 10 includes the first partition wall 311 and the second partition wall 312 between the second substrate and the film layer, the air gap may be provided on the one side of the second substrate. Light of the organic light emitting diode may be multi-reflected due to the air layer provided in the air gap, thereby increasing the amount of light extracted out of the second substrate.

Figure 11:
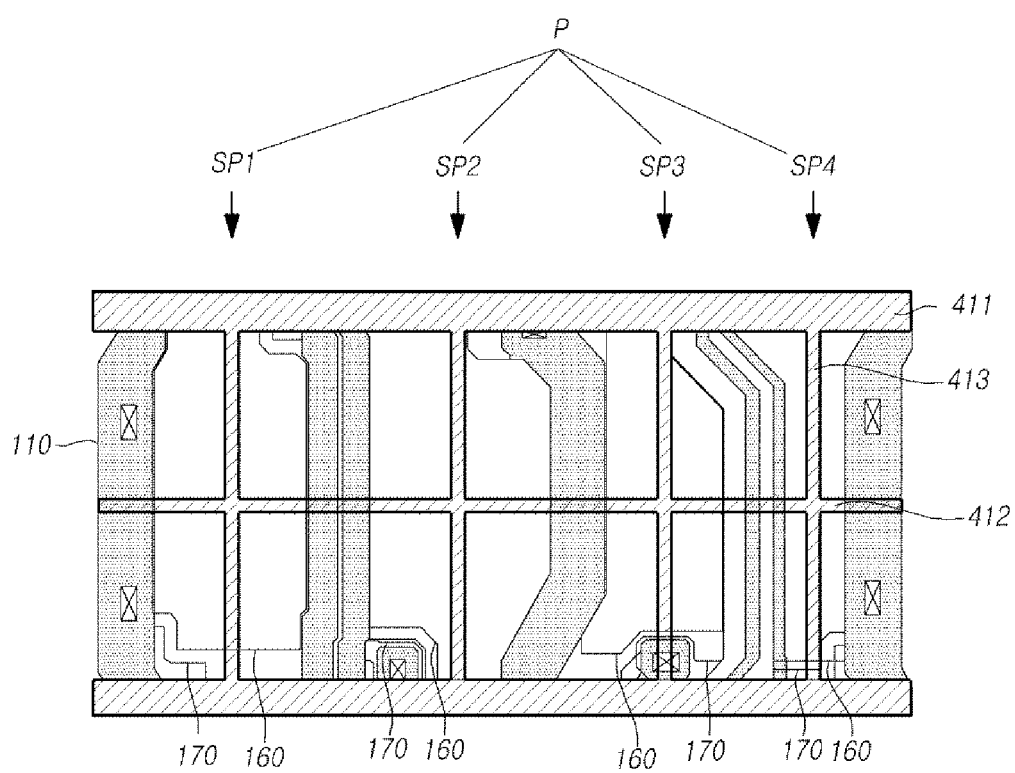

Next, referring to FIG. 11, a first partition wall 411 is provided on one side of the second substrate of the OLED display device according to the present embodiment. The first partition wall 411 is parallel to the gate line on the first substrate and is disposed in the non-emission area. In addition, a second partition wall 412 is provided on the one side of the second substrate. The second partition wall 412 is parallel to the gate line and crosses the emission areas of the first, second, third and fourth sub-pixels SP1, SP2, SP3 and SP4. Furthermore, a third partition wall 413, which crosses each of the first, second, third and fourth sub-pixels SP1, SP2, SP3 and SP4 and is parallel to the data line 110, is included.

Since the OLED display device of FIG. 11 includes the first partition wall 411, the second partition wall 412 and the third partition wall 413 between the second substrate and the film layer, the air gap may be provided on the one side of the second substrate. Light of the organic light emitting diode may be multi-reflected due to the air layer provided in the air gap, thereby increasing the amount of light extracted out of the second substrate.

Figure 12:
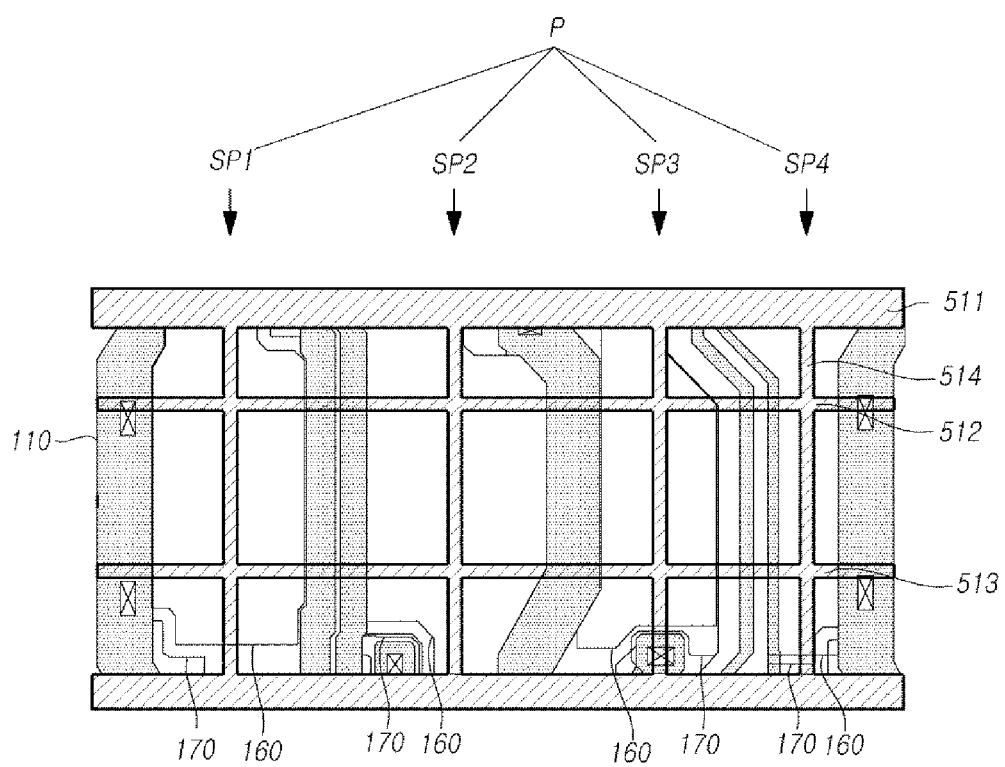

Next, referring to FIG. 12, a partition wall, which is parallel to the gate line and crosses the emission areas of the sub-pixels SP1, SP2, SP3 and SP4, may be further included as compared with FIG. 11.

In other words, a first partition wall 511, which is parallel to the gate line on the first substrate and is disposed in the non-emission area, is provided on one side of the second substrate of the OLED display device according to the present embodiment. In addition, a second partition wall 512 and a third partition wall 513, which are parallel to the gate line and cross the emission areas of the first, second, third and fourth sub-pixels SP1, SP2, SP3 and SP4, are included. Furthermore, a fourth partition wall 514, which crosses each of the first, second, third and fourth sub-pixels SP1, SP2, SP3 and SP4 and is parallel to the data line 110, is included.

Since the OLED display device of FIG. 12 includes the first partition wall 511, the second partition wall 512, the third partition wall 513 and the fourth partition wall 514 between the second substrate and the film layer, the air gap may be provided on the one side of the second substrate. Light of the organic light emitting diode may be multi-reflected due to the air layer provided in the air gap, thereby increasing the amount of light extracted out of the second substrate.

Figure 13:
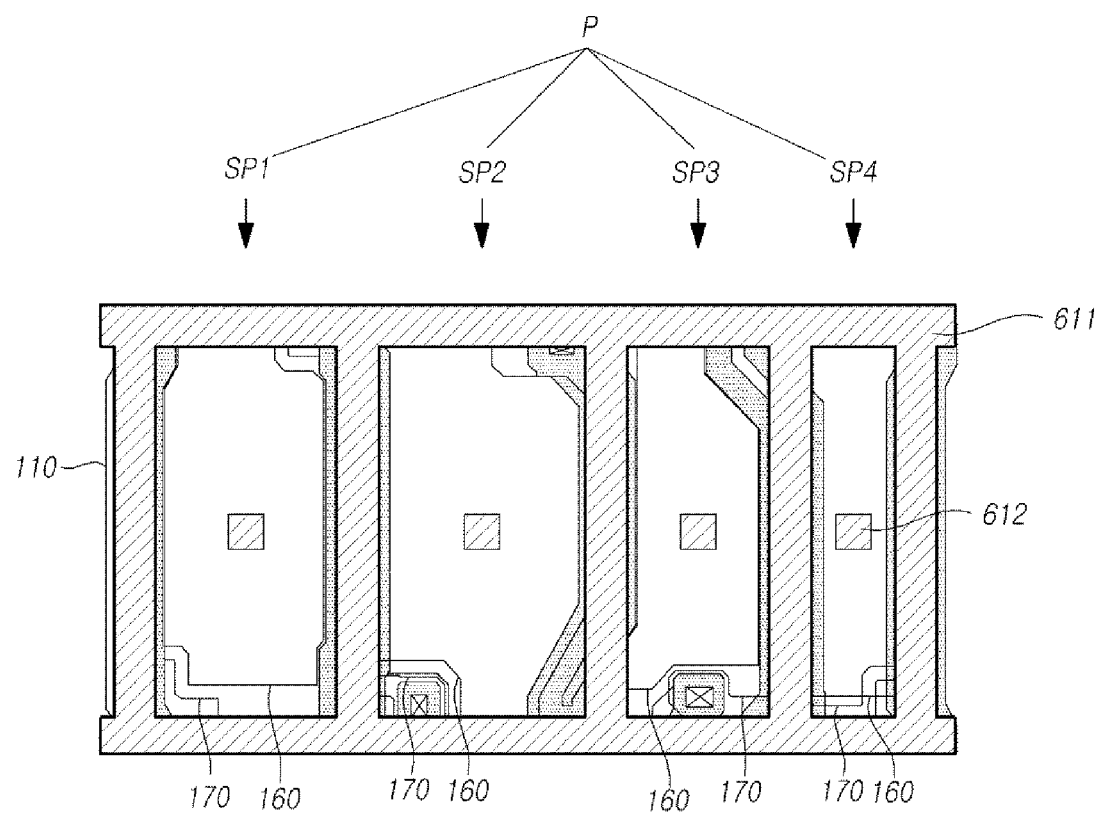

Next, referring to FIG. 13, a first partition wall 611, which is parallel to the gate line on the first substrate, overlap the data line 110 and is disposed in the non-emission area, is provided on one side of the second substrate of the OLED display device according to the present embodiment. In addition, a second partition wall 612, which is provided at the center of the emission area of each first, second, third and fourth sub-pixel SP1, SP2, SP3 and SP4, is included.

Here, since the second partition wall 612 is disposed at the center of the emission area, the film layer can be stably supported without sagging in the area corresponding to the emission area.

Since the OLED display device of FIG. 13 includes the first partition wall 611 and the second partition wall 612 between the second substrate and the film layer, the air gap may be provided on the one side of the second substrate. Light of the organic light emitting diode may be multi-reflected due to the air layer provided in the air gap, thereby increasing the amount of light extracted out of the second substrate.

Figure 14:
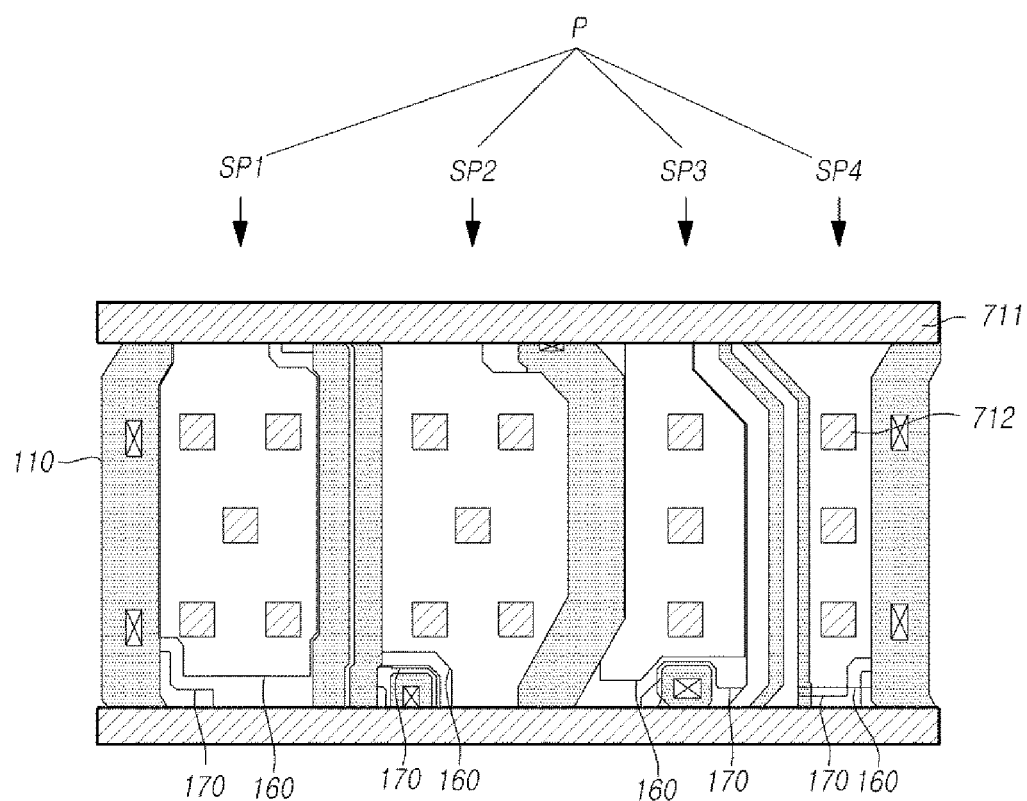

Next, referring to FIG. 14, a first partition wall 711, which is parallel to the gate line on the first substrate and is disposed in the non-emission area, is provided on one side of the second substrate of the OLED display device according to the present embodiment. In addition, at least two second partition walls 712, which are disposed in the emission area of each first, second, third and fourth sub-pixel SP1, SP2, SP3 and SP4, is included.

At this time, the partition walls 712 may be arranged in different numbers for each of the sub-pixels SP1, SP2, SP3 and SP4. Accordingly, the amount of light extracted can be controlled by each sub-pixel SP1, SP2, SP3 and SP4.

Figure 15:
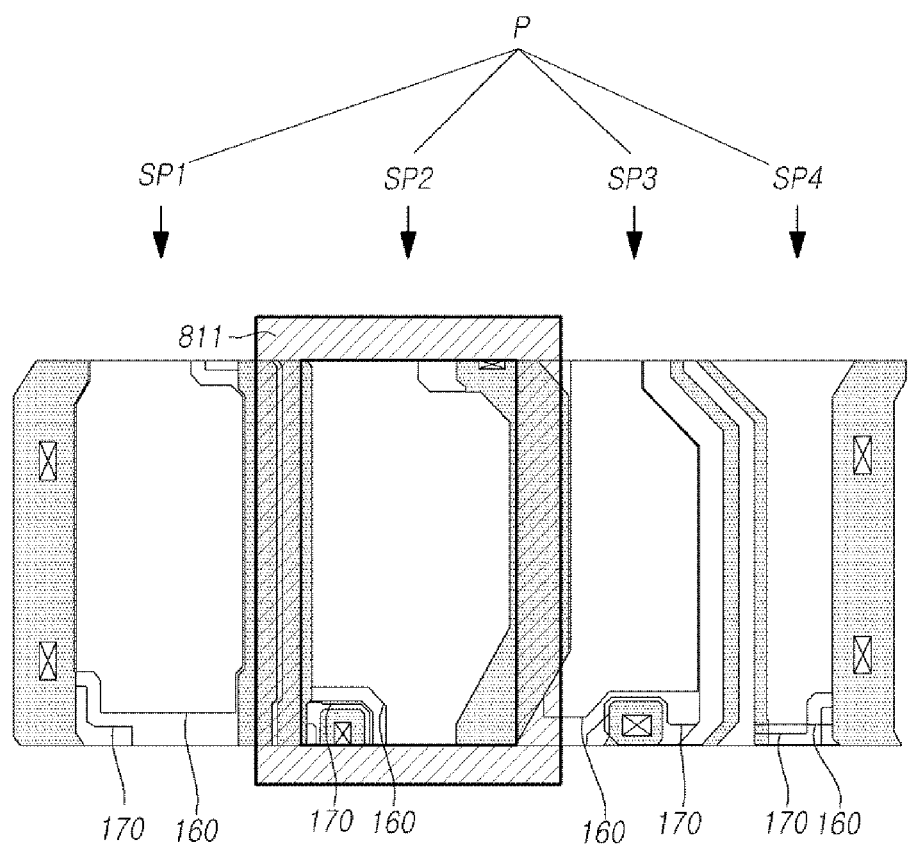

Next, referring to FIG. 15, the OLED display device according to the present embodiment includes a partition wall 811 provided between the second substrate and the film layer. At this time, the partition wall 811 may be parallel to the gate line and overlap the data line 110, and may be disposed in one to three sub-pixels of the four sub-pixels SP1, SP2, SP3 and SP4.

That is, the partition wall 811 according to the present embodiment is disposed in the area corresponding to the non-emission area of a predetermined sub-pixel, and the amount of light extracted can be adjusted by each sub-pixel SP1, SP2, SP3 and SP4.

In the meantime, although FIG. 15 shows a configuration in which the partition wall 811 is provided to correspond to the second sub-pixel, the present embodiment is not limited to this. It is sufficient that the partition wall 811 is parallel to the gate line, overlaps the data line 110, and is disposed in the non-emission area in one to three sub-pixels of the first, second, third and fourth sub-pixels SP1, SP2, SP3 and SP4.

As described above, in the OLED display device according to the present embodiments, the air gap is provided in the substrate out of which light emitted from the organic light emitting diode is extracted, thereby inducing the multiple reflection of light and reducing the amount of light trapped by the polarizer. The amount of light extracted out of the substrate increases to improve the light extraction efficiency.

The features, structures, and effects described in the present disclosure are included in at least one embodiment but are not necessarily limited to a particular embodiment. A person skilled in the art can apply the features, structures, and effects illustrated in the particular embodiment to another embodiment by combining or modifying such features, structures, and effects. It should be understood that all such combinations and modifications are included within the scope of the present disclosure.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode display device, comprising:
a first substrate including a plurality of sub-pixels, which are defined by a plurality of gate lines and a plurality of data lines crossing each other and each include an emission area and a non-emission area;
organic light emitting diodes on the first substrate;
a second substrate opposed to the first substrate;
a black matrix and a color filter layer on one side of the second substrate, the black matrix disposed in the non-emission area and the color filter layer disposed in the emission area of at least one sub-pixel of the plurality of sub-pixels;
a first spacer on the black matrix and overlapping or parallel to one of the plurality of the gate lines and the plurality of data lines;
a film layer on the first spacer; and
a resin layer between the organic light emitting diodes and the film layer,
wherein an air gap is provided between the second substrate and the film layer, and a part of the film layer is exposed by the air gap, and
wherein the film layer has a substantially entire flat surface.

2. The display device of claim 1, wherein the air gap includes a first air gap and a second air gap, and wherein the first air gap is provided by the second substrate, the film layer opposed to the second substrate, and the black matrix and the first spacer between the second substrate and the film layer, and the second air gap is provided by the color filter layer, the film layer opposed to the color filter layer, and the first spacer between the color filter layer and the film layer.

3. The display device of claim 2, wherein a height of the first air gap is higher than a height of the second air gap.

4. The display device of claim 2, wherein the first spacer is formed of an opaque organic material.

5. The display device of claim 1, further comprising a second spacer in the emission area between adjacent portions of the black matrix.

6. The display device of claim 5, wherein the second spacer is in contact with the second substrate.

7. The display device of claim 6, wherein a height of the second spacer is higher than a height of the first spacer, and a top surface of the first spacer is positioned on a same plane as a top surface of the second spacer.

8. The display device of claim 6, wherein the air gap is provided by the second substrate, the film layer opposed to the second substrate, and the second spacer between the second substrate and the film layer.

9. The display device of claim 5, wherein the second spacer is in contact with the color filter layer.

10. The display device of claim 9, wherein a height of the second spacer is equal to a height of the first spacer, and a top surface of the first spacer is positioned on a same plane as a top surface of the second spacer.

11. The display device of claim 9, wherein the air gap is provided by the color filter layer, the film layer opposed to the color filter layer, and the second spacer between the color filter layer and the film layer.

12. The display device of claim 5, wherein the first spacer and the second spacer are formed of a transparent organic material.

13. The display device of claim 1, wherein an insulation layer is provided on the black matrix and the color filter layer, and a plurality of spacers including the first spacer are provided on the insulation layer in the emission area and the non-emission area.

14. The display device of claim 13, wherein the air gap is provided by the insulation layer, the film layer on the insulation layer, and the plurality of spacers between the insulation layer and the film layer.

15. The display device of claim 14, wherein the insulation layer is formed of a transparent organic material, and the plurality of spacers are formed of a transparent inorganic material.

16. The display device of claim 1, wherein an indentation is provided in one side of the second substrate corresponding to at least one emission area.

17. The display device of claim 16, wherein the air gap is provided by top and side surfaces of the second substrate corresponding to the indentation, the film layer opposed to the second substrate, and the black matrix and the first spacer between the second substrate and the film layer.

18. The display device of claim 16, wherein the color filter layer is disposed in a region corresponding to the indentation in the at least one sub-pixel.

19. The display device of claim 18, wherein the air gap is provided by the color filter layer on the indentation, the film layer opposed to the color filter layer, and the black matrix and the first spacer between the color filter layer and the film layer.

20. The display device of claim 1, further comprising a second spacer, and
wherein the first spacer is parallel to the plurality of gate lines, overlaps the plurality of data lines, and is disposed in the non-emission area, and the second spacer is parallel to the plurality of gate lines and crosses the emission areas of the plurality of sub-pixels.

21. The display device of claim 1, wherein the first spacer is disposed to surround at least one to four sub-pixels of the plurality of sub-pixels.

22. The display device of claim 1, further comprising a second spacer, and
wherein the first spacer overlaps the plurality of gate lines, is parallel to the plurality of data lines, and is disposed in the non-emission area, and the second spacer is disposed at a center of the emission area of each sub-pixel.

23. The display device of claim 1, further comprising a second spacer and a third spacer, and
wherein the first spacer is parallel to the plurality of gate lines in the non-emission area, the second spacer is parallel to the plurality of gate lines and crosses the emission areas of the plurality of sub-pixels, and the third spacer is parallel to the plurality of data lines and crosses the emission areas of the plurality of sub-pixels.

24. The display device of claim 23, further comprising a fourth spacer, which crosses the emission areas of the plurality of sub-pixels and is parallel to the second spacer.

25. The display device of claim 1, further comprising a plurality of second spacers,
wherein the first spacer is parallel to the plurality of gate lines in the non-emission area, and the plurality of second spacers are disposed in the emission areas of the plurality of sub- pixels, and
wherein the plurality of second spacers are arranged in different number for at least two sub-pixels.

26. The display device of claim 1, further comprising an insulation layer between the first substrate and the organic light emitting diodes, wherein the insulation layer includes a plurality of convex portions and a plurality of concave portions in the emission area.

27. The display device of claim 1, wherein a refractive index of the resin layer is equal to or less than a refractive index of the film layer.

* * * * *